United States Patent
Ding et al.

(10) Patent No.: US 11,218,152 B2
(45) Date of Patent: Jan. 4, 2022

(54) CHARGE PUMP CIRCUIT AND PHASE-LOCKED LOOP

(71) Applicants: China Communication Microelectronics Technology Co., Ltd., Guangdong (CN); China Communication Technology Co., Ltd., Guangdong (CN)

(72) Inventors: Qing Ding, Guangdong (CN); Haifeng Zhou, Guangdong (CN); Guangsheng Wu, Guangdong (CN); Xiaocong Li, Guangdong (CN)

(73) Assignees: CHINA COMMUNICATION MICROELECTRONICS TECHNOLOGY CO., LTD., Guangdong (CN); CHINA COMMUNICATION TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 16/476,391

(22) PCT Filed: Feb. 5, 2018

(86) PCT No.: PCT/CN2018/075271
§ 371 (c)(1),
(2) Date: Jul. 8, 2019

(87) PCT Pub. No.: WO2018/145612
PCT Pub. Date: Aug. 16, 2018

(65) Prior Publication Data
US 2020/0052705 A1    Feb. 13, 2020

(30) Foreign Application Priority Data
Feb. 7, 2017    (CN) .......................... 201710067159.9

(51) Int. Cl.
*H03L 7/08* (2006.01)
*H03L 7/089* (2006.01)
(Continued)

(52) U.S. Cl.
CPC ............ *H03L 7/0895* (2013.01); *H02M 3/07* (2013.01)

(58) Field of Classification Search
CPC ... H03L 7/0891; H03L 7/0895; H03L 7/0896; H03L 7/0898
See application file for complete search history.

(56) References Cited

U.S. PATENT DOCUMENTS 6,853,253 B2 * 2/2005 Desortiaux ........... H03L 7/0896
327/157
7,382,849 B1 * 6/2008 Groe ..................... H03L 7/0896
327/157
(Continued)

FOREIGN PATENT DOCUMENTS

CN    102347760 A    2/2012
CN    104201880 A    12/2014
(Continued)

OTHER PUBLICATIONS

Int'l Search Report dated May 8, 2018 in Int'l Application No. PCT/CN2018/075271.

*Primary Examiner* — Kenneth B Wells
(74) *Attorney, Agent, or Firm* — Panitch Schwarze Belisario & Nadel LLP

(57) ABSTRACT

A charge pump circuit and phase-locked loop include start, bias, current mirror, charging and discharging feedback control, and charging and discharging matching modules, which are electrically connected in sequence. The start module starts the bias module. The bias module generates constant bias current and outputs same to the current mirror module, which receives and amplifies the bias current for (Continued)

output in two paths. The charging and discharging feedback control module detects the output voltage of a charge pump and controls, according to feedback of the output voltage, the current in the charging and discharging matching module, to suppress the mismatch between charging and discharging currents. The charging and discharging matching module receives an external charging or discharging control signal, to charge or discharge the output load of the charge pump. Charging and discharging currents can be matched within a wide output voltage range, without an operational amplifier.

9 Claims, 4 Drawing Sheets

(51) Int. Cl.
  H03L 7/091 (2006.01)
  H03L 7/093 (2006.01)
  H03L 7/099 (2006.01)
  H02M 3/07 (2006.01)

(56) References Cited

U.S. PATENT DOCUMENTS

| | | | | |
|---|---|---|---|---|
| 8,552,707 | B2* | 10/2013 | Chen | G05F 3/30 |
| | | | | 323/313 |
| 8,598,862 | B2* | 12/2013 | Nikolov | G05F 3/242 |
| | | | | 323/311 |
| 8,614,570 | B2* | 12/2013 | Hirose | G05F 3/242 |
| | | | | 323/313 |
| 8,941,437 | B2* | 1/2015 | Nakamoto | G05F 3/205 |
| | | | | 327/539 |
| 9,058,047 | B2* | 6/2015 | Takahashi | G05F 3/30 |
| 9,270,265 | B2* | 2/2016 | Nakamoto | H03K 17/223 |
| 9,312,747 | B1* | 4/2016 | Svorc | H02M 1/36 |
| 9,667,134 | B2* | 5/2017 | Qaiyum | H02M 1/36 |
| 9,811,107 | B2* | 11/2017 | Marinca | G05F 3/267 |
| 9,864,392 | B2* | 1/2018 | Georgiou | G05F 3/24 |
| 2004/0085106 | A1 | 5/2004 | Jeong | |

FOREIGN PATENT DOCUMENTS

| | | |
|---|---|---|
| CN | 106685415 A | 5/2017 |
| CN | 206481287 U | 9/2017 |

* cited by examiner

CHARGE PUMP CIRCUIT AND PHASE-LOCKED LOOP

CROSS-REFERENCE TO RELATED APPLICATION

This application is a Section 371 of International Application No. PCT/CN2018/075271, filed Feb. 5, 2018, which was published in the Chinese language on Aug. 16, 2018 under International Publication No. WO 2018/145612 A1, which claims priority under 35 U.S.C. § 119 to Chinese Patent Application No. 201710067159.9, filed on Feb. 7, 2017, the disclosures of which are incorporated herein by reference.

BACKGROUND OF THE INVENTION

1. Technical Field

The invention relates to the technical field of integrated circuits, in particular to a low-voltage and wide-output range charge pump circuit and a phase-locked loop.

2. Description of Related Art

As one of the most popular frequency synthesizer structures in modern wireless communication system applications, a phase locked loop (PLL) can realize signal modulation and demodulation, as well as clock recovery, and generate local oscillator signals for carrier recovery of a mixer and a wireless receiver. A charge pump phase-locked loop (CP-PLL) has become the most common phase-locked loop circuit due to the characteristics of high speed and low noise. A charge pump (CP) circuit plays a very important role in a charge pump phase-locked loop. The main function of the charge pump circuit is to convert UP and DN pulse digital signals from a phase frequency detector (PFD) into analog voltage signals through a low-pass filter (LPF), and the analog voltage signals control the oscillation frequency of a voltage control oscillator (VCO). Therefore, the charge pump circuit has a very important influence on the characteristics of the whole phase-locked loop.

In a traditional circuit structure realizing the match of the charging current and the discharging current of a charge pump circuit, an operational amplifier circuit is used to hold the voltage between different nodes, which not only increases the complexity of the circuit, but also brings certain hidden dangers to the overall stability of the circuit. Meanwhile, in order to realize a large output voltage swing, the structure of an operational amplifier needs to realize rail-to-rail input and output characteristics, which further increases the design difficulty of the operational amplifier. Moreover, an operational amplifier working at low voltages often has low operating frequencies and cannot be applied to high-frequency fields.

BRIEF SUMMARY OF THE INVENTION

In view of this, it is necessary to provide a charge pump circuit and a phase-locked loop which can realize the match of the charging current and the discharging current of a charge pump within a wide output voltage range without providing an additional operational amplifier and have simple circuit structure.

A charge pump circuit comprises a start module, a bias module, a current mirror module, a charging and discharging feedback control module and a charging and discharging matching module which are electrically connected in sequence; wherein the start module is used for starting the bias module;

the bias module is used for generating constant bias current and outputting same to the current mirror module;

the current mirror module is used for receiving the bias current, and amplifying the bias current and outputting the amplified bias current in two paths;

the charging and discharging feedback control module is used for detecting the output voltage of a charge pump and controlling, according to the feedback of the output voltage, the charging current or the discharging current in the charging and discharging matching module, so as to suppress the mismatch between the charging current and the discharging current; and the charging and discharging matching module is used for receiving an external charging control signal or an external discharging control signal, so as to charge or discharge the output load of the charge pump.

In one embodiment, the start module comprises transistors M1, M2, and M3, wherein the transistor M1 and the transistor M3 form a phase inverter, a source of the transistor M1 and a source of the transistor M2 are connected to a power end, and a drain of the transistor M1 is connected to a gate of the transistor M2 and then to a drain of the transistor M3; a gate of the transistor M1 is connected to a gate of the transistor M3, and a source of the transistor M3 is grounded; and the gate of the transistor M1 and a drain of the transistor M2 are connected to the bias module.

In one embodiment, the bias module comprises transistors M4, M5, M6, M7, M8, M9, and M10, wherein a source of the transistor M4, a source of the transistor M5, and a source of the transistor M10 are all connected to the power end; a gate of the transistor M4 is connected to a gate of the transistor M5; a drain of the transistor M4 is connected to a gate of the transistor M4, the start module, a drain of the transistor M6, and a gate of the transistor M10; a drain of the transistor M5 is connected to a drain of the transistor M7 and a gate of the transistor M7; a gate of the transistor M6 is connected to the gate of the transistor M7; a source of the transistor M6 is connected to a drain of the transistor M8; a source of the transistor M7 is connected to a drain of the transistor M9, a gate of the transistor M9, and the start module; a source of the transistor M8 and a source of the transistor M9 are both grounded; and a drain of the transistor M10 is connected to a current mirror circuit.

In one embodiment, the bias module further comprises resistors R1, R2, and R3, wherein the source of the transistor M8 is grounded via the resistor R1, and the resistors R2 and R3 are grounded in parallel and are pseudo resistors of the resistor R1.

In one embodiment, the current mirror module comprises transistors M11, M12, M13, M14, M15, M16, M17, M18, and M19, wherein a source of the transistor M11, a source of the transistor M12, a source of the transistor M15, a source of the transistor M16, and a source of the transistor M17 are all grounded; a source of the transistor M13, a source of the transistor M14, a source of the transistor M18, and a source of the transistor M19 are all connected to the power end; a drain of the transistor M11 is connected to a gate of the transistor M11 and the bias module; a gate of the transistor M11 is connected to a gate of the transistor M12; a drain of the transistor M12 is connected to a drain of the transistor M13 and a gate of the transistor M13; the gate of the transistor M13 is connected to a gate of the transistor M14; a drain of the transistor M14 is connected to a drain of the transistor M15, a gate of the transistor M15, and a gate of the M17; the gate of the transistor M15 is connected to a gate of the transistor M16; a drain of the transistor M16 is connected to a drain of the transistor M18 and a gate of the transistor M18; the gate of the transistor M18 is connected to the gate of the transistor M19; and a drain of the transistor M17 and a drain of the transistor M19 are connected to the charging and discharging matching module.

In one embodiment, the charging and discharging matching module comprises a charging unit and a discharging unit, wherein the charging unit receives the bias current in one of the paths output from the current mirror module, and outputs the charging current according to the charging control signal to charge an output load of the charge pump; and the discharging unit receives the bias current in another of the paths output from the current mirror module, and outputs the discharging current according to the discharging control signal to discharge the output load of the charge pump.

In one embodiment, the charging unit comprises transistors M20, M21, M22, M23, and M24, wherein a source of the transistor M20, a drain and a source of the transistor M21, and a source of the transistor M22 are all connected to the power end; a gate of the transistor M20 is grounded, and a drain of the transistor M20 is connected to a source of the transistor M23 and the charging and discharging feedback control module; a gate of the transistor M21 is connected to a gate of the transistor M23 and a gate of the transistor M24; a gate of the transistor M22 receives the charging control signal, and a drain of the transistor M22 is connected to a source of the transistor M24; a drain of the transistor M23 is connected to a gate of the transistor M23 and the current mirror module; and a drain of the transistor M24 is connected to the output load of the charge pump.

The discharging unit comprises transistors M25, M26, M27, M28, and M29, wherein a drain of the transistor M25 is connected to a gate of the transistor M25 and the current mirror module; a gate of the transistor M25 is connected to a drain of the transistor M25, a gate of the transistor M26, and a gate of the transistor M28; a source of the transistor M25 is connected to a drain of the transistor M27 and the charging and discharging feedback control module; a drain of the transistor M26 is connected to the output load of the charge pump, and a source of the transistor M26 is connected to a drain of the transistor M29; a gate of the transistor M27 is connected to the power end, and a source of the transistor M27, a source and a drain of the transistor M28, and a source of the transistor M29 are all grounded; and a gate of the transistor M29 receives the discharging control signal.

In one embodiment, the charging and discharging feedback control module comprises a charging feedback unit and a discharging feedback unit; the charging feedback unit is connected to the charging unit and the output load of the charge pump; the charging feedback unit is used for detecting the output voltage of the charge pump and controlling, according to the feedback of the output voltage, the discharging current output by the discharging unit, so as to suppress the mismatch between the charging current and the discharging current; the discharging feedback unit is connected to the discharging unit and the output load of the charge pump; and the discharging feedback unit is used for detecting the output voltage of the charge pump and controlling, according to the feedback of the output voltage, the charging current output by the charging unit, so as to suppress the mismatch between the charging current and the discharging current.

In one embodiment, the charging feedback unit comprises a transistor M30, and the discharging feedback unit comprises a transistor M31, wherein a source of the transistor M30 is connected to the power end, a drain of the transistor M30 is connected to the charging unit, and a gate of the transistor M30 is connected to the output load of the charge pump; and a source of the transistor M31 is grounded, a drain of the transistor M31 is connected to the discharging unit, and a gate of the transistor M31 is connected to the output load of the charge pump.

The above charge pump circuit comprises the start module, the bias module, the current mirror module, the charging and discharging feedback control module and the charging and discharging matching module which are electrically connected in sequence, According to the detected output voltage of the charge pump, the charging current or the discharging current in the charging and discharging matching module can be controlled by a charging feedback circuit; so as to suppress the mismatch between the charging current and the discharging current, thus maintaining the match of the charging current and the discharging current of the charge pump within a wide output voltage range. Meanwhile, the charge pump circuit in the embodiment of the invention has a simple structure and is suitable for a low-voltage working environment.

In addition, the invention provides a phase-locked loop which comprises the charge pump circuit.

DETAILED DESCRIPTION OF THE INVENTION

In order to facilitate the understanding of the present invention, the present invention will be described more fully below with reference to the relevant drawings. Preferred embodiments of the present invention are shown in the accompanying drawings. However, the present invention may be implemented in many different ways and is not limited to the embodiments described herein. On the contrary, the purpose of providing these embodiments is to make the understanding to the disclosure of the present invention more thorough and comprehensive.

Unless otherwise defined, all technical and scientific terms used herein have the same meaning as commonly understood by those skilled in the technical field of the present invention. The terms used herein in the description of the present invention are for the purpose of describing specific embodiments only and are not intended to limit the present invention. As used herein, the term "and/or" includes any and all combinations of one or more related listed items.

Figure 1:
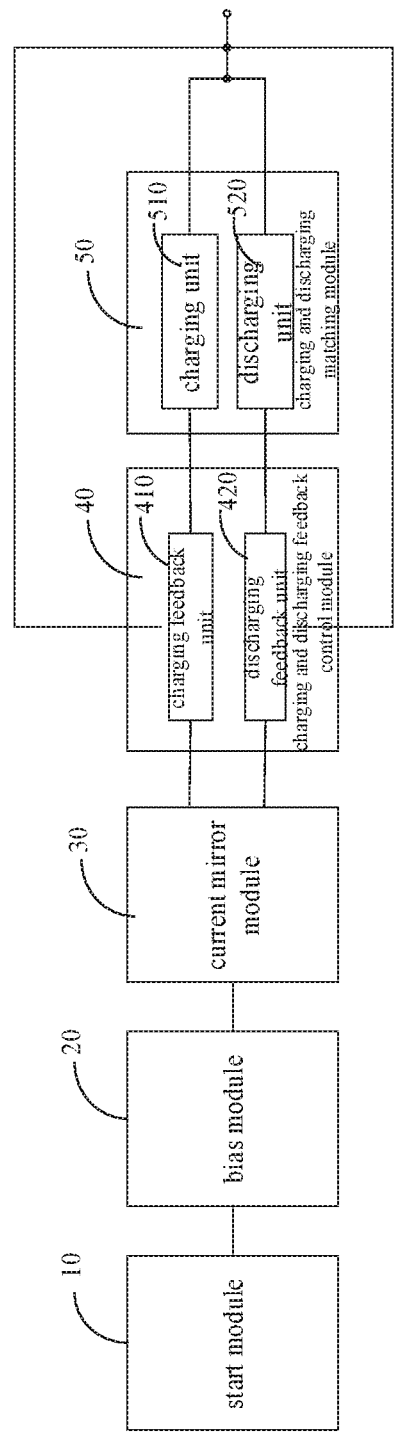
FIG. 1 is a structure block diagram of a charge pump circuit in one embodiment.

FIG. 1 is a structure block diagram of a charge np circuit in one embodiment. A charge pump circuit comprises a start module 10, a bias module 20, a current mirror module 30, a charging and discharging feedback control module 40 and a charging and discharging matching module 50 which are electrically connected in sequence.

The start module 10 is used for starting the bias module 20; the bias module 20 is used for generating constant bias current and outputting same to the current mirror module 30; the current mirror module 30 is used for receiving the bias current, and amplifying the bias current and outputting the amplified bias current in two paths; the charging and discharging feedback control module 40 is used for detecting the output voltage of a charge pump and controlling, according to the feedback of the output voltage, the charging current or the discharging current in the charging and discharging matching module 50, so as to suppress the mismatch between the charging current and the discharging current; and the charging and discharging matching module 50 is used for receiving an external charging control signal or an external discharging control signal, so as to charge or discharge the output load of the charge pump.

The above charge pump circuit comprises the start module 10, the bias module 20, the current mirror module 30, the charging and discharging feedback control module 40 and the charging and discharging matching module 50 which are electrically connected in sequence. According to the detected output voltage of the charge pump, the Charging current or the discharging current in the charging and discharging matching module 50 can be controlled by a charging feedback circuit, so as to suppress the mismatch between the charging current and the discharging current, thus maintaining the match of the charging current and the discharging current of the charge pump within a wide output voltage range. Meanwhile, the charge pump circuit it in the embodiment of the invention has a simple structure and is suitable for a low-voltage working environment.

Figure 2:
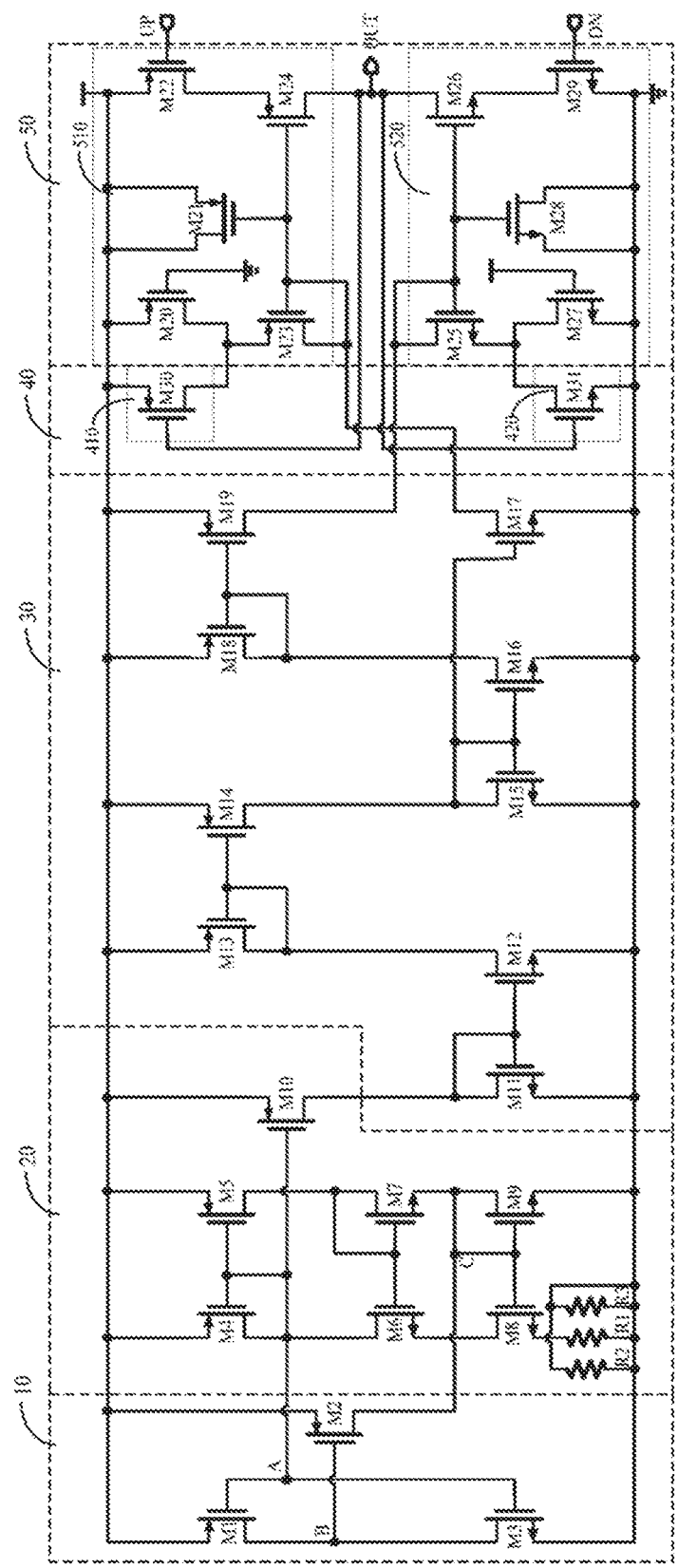
FIG. 2 is a schematic circuit diagram of a charge pump circuit in one embodiment.

In one embodiment, referring to FIG. 2, the start module 10 comprises transistors M1, M2, and M3. The transistors are MOS transistors, the transistors M1 and M2 are P-channel MOS transistors (PMOS), and the transistor M3 is an N-channel MOS transistor (NMOS). The transistor M1 and the transistor M3 form a phase inverter, a source of the transistor M1 and a source of the transistor M2 are connected to a power end, and a drain of the transistor M1 is connected to a gate of the transistor M2 and then to a drain of the transistor M3. A gate of the transistor M1 is connected to a gate of the transistor M3, and a source of the transistor M3 is grounded. The gate of the transistor M1 and a drain of the transistor M2 are respectively connected to the bias module 20.

When a power supply is turned on, all the transistors are in the off state, a node A is at a high level and a node C is at a low level. After the start module 10 is added, the transistor M1 and the transistor M2 form a phase inverter, a node B is at a low level, the MOS transistor M2 is turned on to charge the node C, so the level of the node C rises, and the bias module 20 starts to deviate from a zero point. When the bias module 20 reaches a stable state, the node A is at a low level, the node B is at a high level, the MOS transistor M2 is turned off, and the start module 10 no longer affects the bias module 20.

In one embodiment, the bias module 20 adopts a structure of a non-linear reference bias module 20, and comprises transistors M4, M5, M6, M7, M8, M9 and M10. The transistors are MOS transistors, the transistors M4, M5, and M10 are P-channel MOS transistors (PHOS), and the transistors M6, M7, M8, and M9 are N-channel MOS transistors (NMOS).

A source of the transistor M4, a source of the transistor M5, and a source of the transistor M10 are all connected to the power end. A gate of the transistor M4 is connected to a gate of the transistor M5. A drain of the transistor M4 is connected to a gate of the transistor M4, the start module 10, a drain of the transistor M6, and a gate of the transistor M10. A drain of the transistor M5 is connected to a drain of the transistor M7 and a gate of the transistor M7. A gate of the transistor M6 is connected to the gate of the transistor M7, and a source of the transistor M6 is connected to a drain of the transistor M8. A source of the transistor M7 is connected to a drain of the transistor M9, a gate of the transistor M9, and the start module 10. A source of the transistor M8 and a source of the transistor M9 are both grounded. A drain of the transistor M10 is connected to a current mirror circuit. A stable bias voltage is generated by the bias module 20, and then the MOS transistors in the bias module 20 are controlled to generate a constant bias current, wherein the constant bias current generated by the bias module 20 is about 10 uA.

In one embodiment, the bias module 20 further comprises resistors R1, R2, and R3, wherein the source of the transistor M8 is grounded via the resistor R1, and the resistors R2 and R3 are connected in parallel and are pseudo resistors of the resistor R1. When the layout is realized, the resistors R2 and R3 are placed on both sides of the resistor R1, so that the physical environment around the resistor R1 is uniform, and the influence of process fluctuation on the resistance value of the resistor R1 is reduced.

In one embodiment, the current mirror module 30 comprises transistors M11, M12, M13, M14, M15, M16, M17, M18, and M19. The transistors are MOS transistors, the transistors M13, M14, M18, and M19 are P-channel MOS transistors (PMOS), and the transistors M11, M12, M15, M16, and M17 are N-channel MOS transistors (NMOS). The transistor M11 and the transistor M12 form a first current mirror pair, the transistor M13 and the transistor M14 form a second current mirror pair, the transistor M15, the transistor M16, and the transistor M17 form a third current mirror pair, and the transistor M18 and the transistor M19 form a fourth current mirror pair.

A source of the transistor M11, a source of the transistor M12, a source of the transistor M15, a source of the transistor M16, and a source of the transistor M17 are all grounded. A source of the transistor M13, a source of the transistor M14, a source of the transistor M18, and a source of the transistor M19 are all connected to the power end. A drain of the transistor M11 is connected to a gate of the transistor M11 and the drain of the transistor M10, and a gate of the transistor M11 is connected to a gate of the transistor M12. A drain of the transistor M12 is connected to a drain of the transistor M13 and a gate of the transistor M13. The gate of the transistor M13 is connected to a gate of the transistor M14. A drain of the transistor M14 is connected to a drain of the transistor M15, a gate of the transistor M15, and a gate of the M17. The gate of the transistor M15 is connected to a gate of the transistor M16. A drain of the transistor M16 is connected to a drain of the transistor M18 and a gate of the transistor M18. The gate of the transistor M18 is connected to the gate of the transistor M19. A drain of the transistor M17 and a drain of the transistor M19 are respectively connected to the charging and discharging matching module 50.

In the third current mirror pair, the transistor M16 is a mirror image of the transistor M15, and the transistor M17 is another mirror image of the transistor M15. After the bias current output by the bias module 20 passes through the first current mirror pair and the second current mirror pair, the bias module 20 is divided into two paths by the third current mirror, one path is amplified into 1 MA constant current by the transistor M16 and the fourth current mirror pair and then output to the charging and discharging matching module 50, and the other path is amplified into 1 MA constant current by the transistor M17 and then output to the charging and discharging matching module 50. The constant current generated by the bias module 20 is about 10 uA. After passing through the four current mirror pairs: the transistors M11/M12, the transistors M13/M14, the transistors M15/M16/M17, and the transistors M18/M19, the 10 uA constant current can be amplified to about 500 uA, thus realizing current amplification.

In one embodiment, the charging and discharging matching module 50 comprises a charging unit 510 and a discharging unit 520, wherein the charging unit receives the bias module 20 output by one path of the current mirror module 30, and outputs the charging current according to the charging control signal to charge an output load of the charge pump; and the discharging unit receives the bias module 20 output by the other path of the current mirror module 30, and outputs the discharging current according to the discharging control signal to discharge the output load of the charge pump.

In one embodiment, the charging unit 510 comprises transistors M20, M21, M22, M23, and M24. The discharging unit 520 comprises transistors M25, M26, M27, M28, and M29. The transistors are MOS transistors, the transistors M20, M21, M22, M23, and M24 are P-channel MOS transistors (PMOS), and the transistors M25, M26, M27, M28, and M29 are N-channel MOS transistors (NMOS).

A source of the transistor M20, a drain and a source of the transistor M21, and a source of the transistor M22 are all connected to the power end; a gate of the transistor M20 is grounded, and a drain of the transistor M20 is connected to a source of the transistor M23 and the charging and discharging feedback control module 40.

A gate of the transistor M21 is connected to a gate of the transistor M23 and a gate of the transistor M24. A gate of the transistor M22 receives the charging control signal (UP), and a drain of the transistor M22 is connected to a source of the transistor M24. A drain of the transistor M23 is connected to a gate of the transistor M23 and a drain of the transistor M17. A drain of the transistor M24 is connected to the output load of the charge pump. A drain of the transistor M25 is connected to a gate of the transistor M25 and a drain of the transistor M19; a gate of the transistor M25 is connected to a drain of the transistor M25, a gate of the transistor M26, and a gate of the transistor M28; and a source of the transistor M25 is connected to a drain of the transistor M27 and the charging and discharging feedback control module 40. A drain of the transistor M26 is connected to the output load of the charge pump, and a source of the transistor M26 is connected to a drain of the transistor M29. A gate of the transistor M27 is connected to the power end, and a source of the transistor M27, a source and a drain of the transistor M28, and a source of the transistor M29 are all grounded. A gate of the transistor M29 receives the discharging control signal (DN).

In one embodiment, the charging and discharging feedback control module 40 comprises a charging feedback unit 410 and a discharging, feedback unit 420. The charging feedback unit 410 is connected to the charging unit 510 and the output load of the charge pump; the charging feedback unit 410 is used for detecting the output voltage of the charge pump and controlling, according to the feedback of the output voltage, the discharging current output by the discharging unit 520, so as to suppress the mismatch between the charging current and the discharging current. The discharging feedback unit 420 is connected to the discharging unit 520 and the output load of the charge pump; and the discharging feedback unit 420 is used for detecting the output voltage of the charge pump and controlling, according to the feedback of the output voltage, the charging current output by the charging unit 510, so as to suppress the mismatch between the charging current and the discharging current.

In one embodiment, the charging feedback unit 410 comprises a transistor M30, the transistor M30 is a P-channel MOS transistor (PMOS), the discharging feedback unit 420 comprises a transistor M31, and the transistor M31 is an N-channel MOS transistor (NMOS). A source of the transistor M30 is connected to the power end, a drain of the transistor M30 is connected to a drain of the transistor M20 and a source of the transistor M23, and a gate of the transistor M30 is connected to the output load of the charge pump. A source of the transistor M31 is grounded, a drain of the transistor M31 is connected to a source of the transistor M25 and a drain of the transistor M27, and a gate of the transistor M31 is connected to the output load of the charge pump.

Specifically, the charging control signal UP controls the switching MOS transistor M22 in the charging unit 510, and the discharging control signal IA controls the switching MOS transistor M26 in the discharging unit 520. When the charging control signal UP and the discharging control signal IA are both at high levels, the charging unit 510 and the discharging unit 520 form a loop. The charging and discharging feedback control module 40 detects the output voltage OUT of the charge pump and feeds the detected output voltage back to the transistor M30 of the charging feedback unit 410 or the transistor M31 of the discharging feedback unit 420, thereby controlling the charging and discharging matching module 50 to realize matching within a wide output range.

Further, when the output voltage OUT rises, the transistor M30 of the charging feedback unit 410 enters a deep triode region, and the equivalent on-resistance decreases, reducing the current mirrored to an output branch (the transistor M26 and the transistor M29) in the discharging unit 520, thus reducing the mismatch between the charging current and the discharging current. When the output voltage OUT decreases, the transistor M31 of the discharging feedback unit 420 enters the deep triode region, and the equivalent on-resistance decreases, reducing the current mirrored to an output branch (the transistor M22 and the transistor M24) in the charging unit 510, thus reducing the mismatch between the charging current and the discharging current. Through the above charge pump circuit, the match of the charging current and the discharging current of the charge pump within a wide output voltage range can be realized. Meanwhile, the charge pump circuit in the embodiment of the invention has a simple structure and is suitable for a low-voltage working environment.

Figure 3:
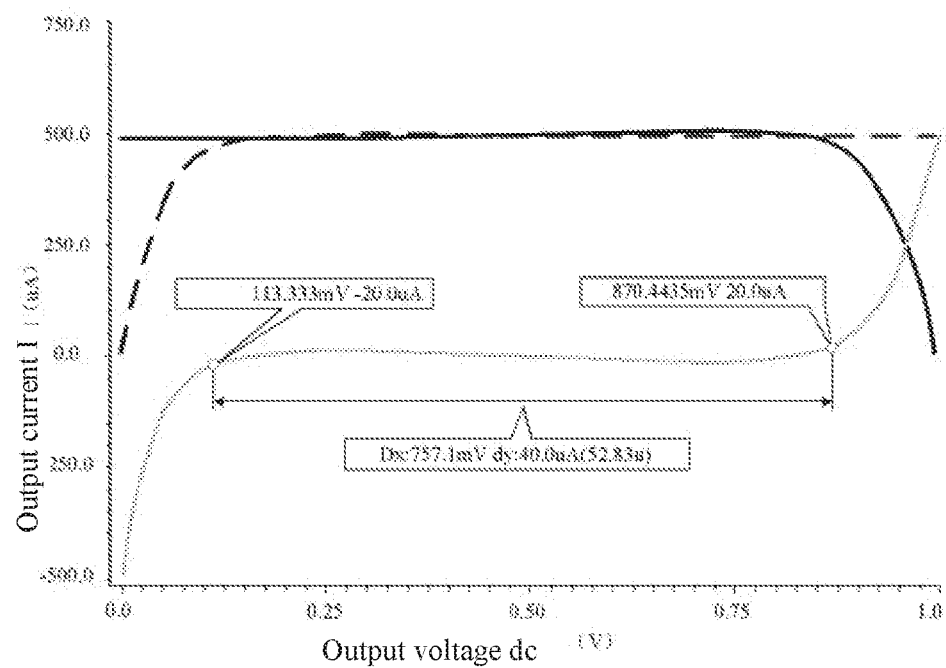
FIG. 3 is a matching simulation diagram of the charging current and the discharging current of a charge pump in one embodiment.
Figure 4:
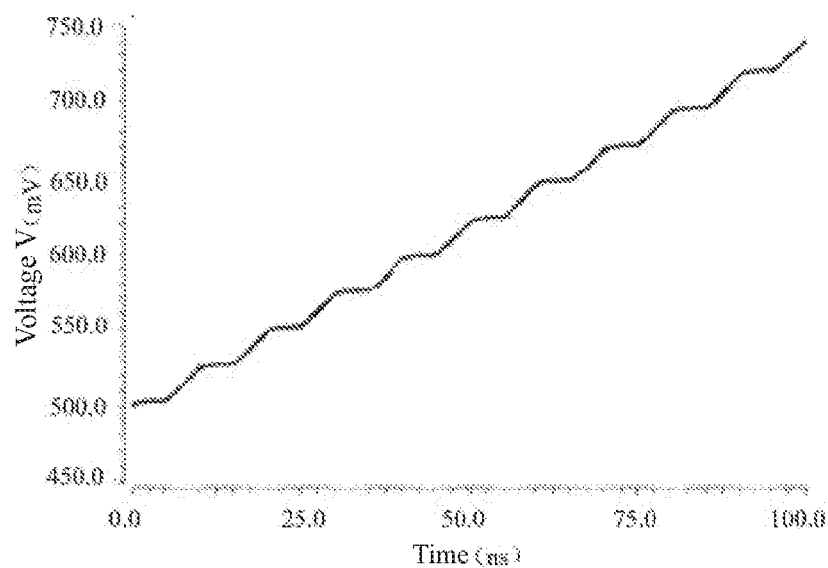
FIG. 4 is a transient simulation diagram of a charge pump charging at 100 MHz in one embodiment.
Figure 5:
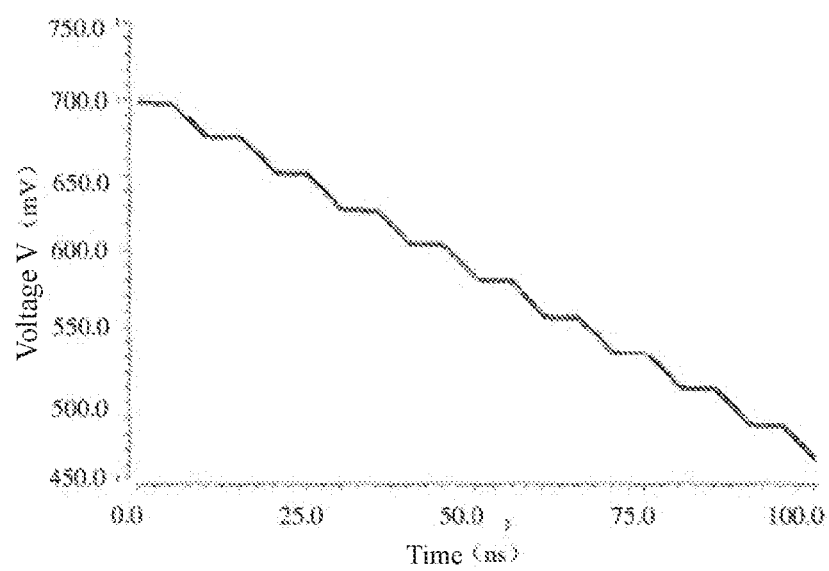
FIG. 5 is a transient simulation diagram of a charge pump discharging at 100 MHz in one embodiment.

FIG. 3 is a matching simulation diagram of the charging current and the discharging current of the charge pump, wherein the solid black line represents the relationship between the charging current and the output voltage, the dotted black line represents the relationship between the discharging current and the output voltage, and the solid gray line represents the difference between the charging current and the discharging current within the whole output swing range. As can be seen from FIG. 3, when the supply voltage is 1 V, the output voltage swings from 113 mV to 870 mV, and the difference between the charging current and the discharging current is less than 4%. FIG. 4 is a transient simulation diagram of the charge pump charging at 100 MHz, and FIG. 5 is a transient simulation diagram of the charge pump discharging at 100 MHz. As can be seen from FIG. 4 and FIG. 5, when the charging control signal or the discharging control signal is at 100 MHz, the transient simulation of charging and discharging of the charge pump has no burr phenomenon. A traditional circuit using an operational amplifier to expand the matching of the charging current and the discharging current of a charge pump has a complex structure, and the working frequency range thereof is affected by the bandwidth of the operational amplifier, so the circuit cannot work at high frequencies. In the embodiment of the invention, the charge pump circuit can work within a high frequency range. Even without an operational amplifier, the matching of the charging current and the discharging current of the charge pump can be maintained within a wide output voltage range.

In addition, a phase-locked loop (not shown in the figures) is also provided, and comprises the charge pump circuit in any of the above embodiments. Since the charge pump circuit in any of the above embodiments is arranged in the phase-locked loop, the matching of the charging current and the discharging current of the charge pump can be maintained within a wide output voltage range. In one embodiment, the charge pump circuit is suitable for a low-voltage and low-power phase-locked loop system for its simple structure.

The technical features of the above-described embodiments can be combined freely, and not all possible combinations of the technical features in the above-described embodiments are described for simplicity of description. However, as long as there is no contradiction between the combinations of these technical features, they should be considered within the scope of this specification.

The above-mentioned embodiments only describe several implementations of the present invention in a specific and detailed way, but it is not to be understood as limiting the scope of the invention. It should be noted that a person of ordinary skill in the art can make several modifications and improvements without departing from the spirit of the present invention, which all belong to the scope of this invention, Therefore, the scope of protection of the patent for the invention shall be subject to the appended claims.

What is claimed is:

1. A charge pump circuit, comprising a start module, a bias module, a current mirror module, a charging and discharging feedback control module and a charging and discharging matching module electrically connected in sequence; wherein the start module is configured to start the bias module;

the bias module is configured to generate a constant bias current and output the bias current to the current mirror module;

the current mirror module is configured to receive the bias current, amplify the bias current and output the amplified bias current in two paths;

the charging and discharging feedback control module is configured to detect an output voltage of the charge pump circuit, and control, according to feedback of the output voltage, a charging current or discharging current in the charging and discharging matching module, so as to suppress mismatch between the charging current and the discharging current; and the charging and discharging matching module is configured to receive an external charging control signal or an external discharging control signal, so as to charge or discharge an output load of the charge pump, the bias module comprises first, second, third, fourth, fifth, sixth and seventh transistors, a source of the first transistor, a source of the second transistor, and a source of the seventh transistor are connected to a power end, a gate of the first transistor is connected to a gate of the second transistor, a drain of the first transistor is connected to a gate of the first transistor, the start module, a drain of the third transistor, and a gate of the seventh transistor, a drain of the second transistor is connected to a drain of the fourth transistor and a gate of the fourth transistor, a gate of the third transistor is connected to the gate of the fourth transistor, a source of the third transistor is connected to a drain of the fifth transistor, a source of the fourth transistor is connected to a drain of the sixth transistor, a gate of the sixth transistor, and the start module, a source of the fifth transistor and a source of the sixth transistor are both grounded, and a drain of the seventh transistor is connected to a current mirror circuit.

2. The charge pump circuit according to claim 1, wherein the start module comprises eighth, ninth, and tenth transistors, the eighth transistor and the tenth transistor form a phase inverter, a source of the eighth transistor and a source of the ninth transistor are connected to a power end, a drain of the eighth transistor is connected to a gate of the ninth transistor and to a drain of the tenth transistor, a gate of the eighth transistor is connected to a gate of the tenth transistor, a source of the tenth transistor is grounded, and the gate of the eighth transistor and a drain of the ninth transistor are connected to the bias module.

3. The charge pump circuit according to claim 1, wherein the bias module further comprises resistors R1, R2, and R3, the source of the fifth transistor is grounded via the resistor R1, and the resistors R2 and R3 are grounded in parallel and are pseudo resistors of the resistor R1.

4. The charge pump circuit according to claim 2, wherein the current mirror module comprises eleventh, twelfth, thirteenth, fourteenth, fifteenth, sixteenth, seventeenth, eighteenth and nineteenth transistors, a source of the eleventh transistor, a source of the twelfth transistor, a source of the fifteenth transistor, a source of the sixteenth transistor, and a source of the seventeenth transistor are grounded, and a source of the thirteenth transistor, a source of the fourteenth transistor, a source of the eighteenth transistor, and a source of the nineteenth transistor are connected to a power end; and a drain of the eleventh transistor is connected to a gate of the eleventh transistor and the bias module, a gate of the eleventh transistor is connected to a gate of the twelfth transistor, a drain of the twelfth transistor is connected to a drain of the thirteenth transistor and a gate of the thirteenth transistor, the gate of the thirteenth transistor is connected to a gate of the fourteenth transistor, a drain of the fourteenth transistor is connected to a drain of the fifteenth transistor, a gate of the fifteenth transistor, and a gate of the seventeenth transistor, the gate of the fifteenth transistor is connected to a gate of the sixteenth transistor, a drain of the sixteenth transistor is connected to a drain of the eighteenth transistor and a gate of the eighteenth transistor, the gate of the eighteenth transistor is connected to the gate of the nineteenth transistor, and a drain of the seventeenth transistor and a drain of the nineteenth transistor are connected to the charging and discharging matching module.

5. The charge pump circuit according to claim 4, wherein the charging and discharging matching module comprises a charging unit and a discharging unit, the charging unit receives the bias current in one of the paths output from the current mirror module, and outputs the charging current according to the charging control signal to charge the output load of the charge pump; and the discharging unit receives the bias current in the other of the paths output from the current mirror module, and outputs the discharging current according to the discharging control signal to discharge the output load of the charge pump.

6. The charge pump circuit according to claim 5, wherein the charging unit comprises twentieth, twenty-first, twenty-second, twenty-third and twenty-fourth transistors, a source of the twentieth transistor, a drain and a source of the twenty-first transistor, and a source of the twenty-second transistor are connected to the power end, a gate of the twentieth transistor is grounded, a drain of the twentieth transistor is connected to a source of the twenty-third transistor and the charging and discharging feedback control module, a gate of the twenty-first transistor is connected to a gate of the twenty-third transistor and a gate of the twenty-fourth transistor, a gate of the twenty-second transistor receives the charging control signal, a drain of the twenty-second transistor is connected to a source of the twenty-fourth transistor, a drain of the twenty-third transistor is connected to a gate of the twenty-third transistor and the current mirror module, and a drain of the twenty-fourth transistor is connected to the output load of the charge pump; and the discharging unit comprises twenty-fifth, twenty-sixth, twenty-seventh, twenty-eighth and twenty-ninth transistors, a drain of the twenty-fifth transistor is connected to a gate of the twenty-fifth transistor and the current mirror module, a gate of the twenty-fifth transistor is connected to a drain of the twenty-fifth transistor, a gate of the twenty-sixth transistor, and a gate of the twenty-eighth transistor, a source of the twenty-fifth transistor is connected to a drain of the twenty-seventh transistor and the charging and discharging feedback control module, a drain of the twenty-sixth transistor is connected to the output load of the charge pump, a source of the twenty-sixth transistor is connected to a drain of the twenty-ninth transistor, a gate of the twenty-seventh transistor is connected to the power end, and a source of the twenty-seventh transistor, a source and a drain of the twenty-eighth transistor, and a source of the twenty-ninth transistor are grounded, and a gate of the twenty-ninth transistor receives the discharging control signal.

7. The charge pump circuit according to claim 6, wherein the charging and discharging feedback control module comprises a charging feedback unit and a discharging feedback unit;

the charging feedback unit is connected to the charging unit and the output load of the charge pump, and the charging feedback unit is configured to detect the output voltage of the charge pump and control, according to the feedback of the output voltage, the discharging current output from the discharging unit, so as to suppress the mismatch between the charging current and the discharging current; and the discharging feedback unit is connected to the discharging unit and the output load of the charge pump, and the discharging feedback unit is configured to detect the output voltage of the charge pump and control, according to the feedback of the output voltage, the charging current output from the charging unit, so as to suppress the mismatch between the charging current and the discharging current.

8. The charge pump circuit according to claim 7, wherein the charging feedback unit comprises a thirtieth transistor, and the discharging feedback unit comprises a thirty-first transistor, a source of the thirtieth transistor is connected to the power end, a drain of the thirtieth transistor is connected to the charging unit, and a gate of the thirtieth transistor is connected to the output load of the charge pump; and a source of the thirty-first transistor is grounded, a drain of the thirty-first transistor is connected to the discharging unit, and a gate of the thirty-first transistor is connected to the output load of the charge pump.

9. A phase-locked loop, comprising the charge pump circuit according to claim 1.

* * * * *